(12) United States Patent
Chang et al.

(10) Patent No.: US 6,274,909 B1
(45) Date of Patent: Aug. 14, 2001

(54) GUARD RING STRUCTURE WITH DEEP N WELL ON ESD DEVICES

(75) Inventors: Kun-Zen Chang, Hsin-chu; Deng-Shun Chang; Rong-Tai Kao, both of Hsinchu, all of (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 09/434,562

(22) Filed: Nov. 12, 1999

(51) Int. Cl.[7] ................................................ H01L 29/72
(52) U.S. Cl. ...................... 257/355; 257/356; 257/401; 257/409; 257/550; 438/514; 438/549; 438/983
(58) Field of Search ........................... 257/355, 356, 257/401, 409, 550; 438/514, 549, 983

(56) References Cited

U.S. PATENT DOCUMENTS

| | | | |
|---|---|---|---|
| 5,223,737 | * 6/1993 | Canclini | 257/355 |
| 5,438,005 | 8/1995 | Jang | 437/34 |
| 5,912,494 | 6/1999 | Yu | 257/355 |

* cited by examiner

*Primary Examiner*—Edward Wojciechowicz
(74) *Attorney, Agent, or Firm*—George O. Saile; Stephen B. Ackerman

(57) ABSTRACT

In this invention a deep N-type wall is created surrounding an area that contains an ESD device, or circuit. The ESD device, or circuit, is connected to a chip pad and is first surrounded by a P+ guard ring. The P+ guard ring is then surrounded by the deep N-type wall to block excess current from an ESD event or voltage overshoot from reaching the internal circuitry. The deep N-type wall comprises an N+ diffusion within an N-well which is on top of a deep N-well. The height of the deep N-type wall is approximately 4 to 6 micrometers which provides a capability to absorb much of the current from an ESD event or voltage overshoot.

16 Claims, 4 Drawing Sheets

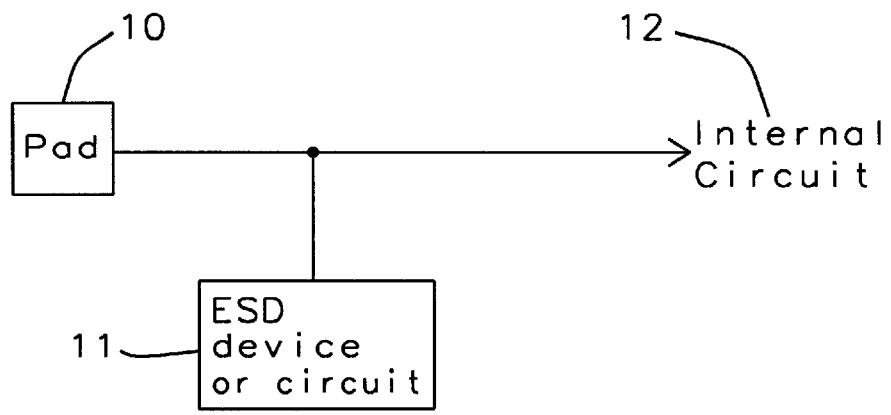
*FIG. 1*
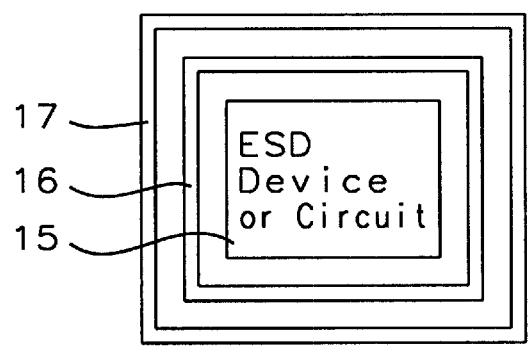
*FIG. 2 - Prior Art*

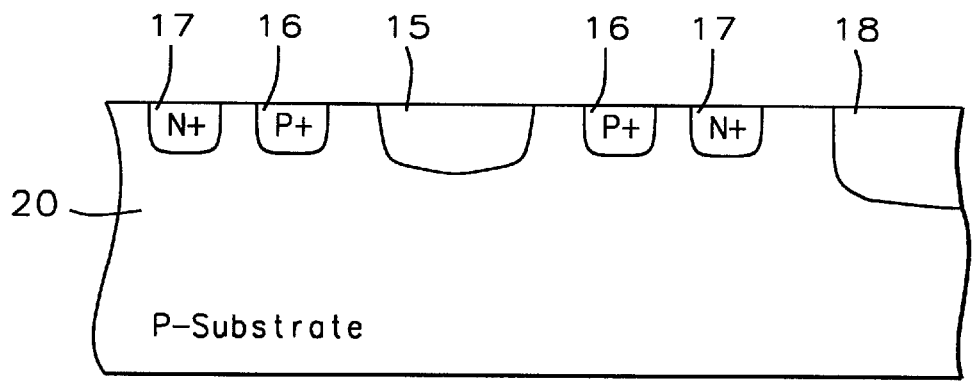
FIG. 3 – Prior At
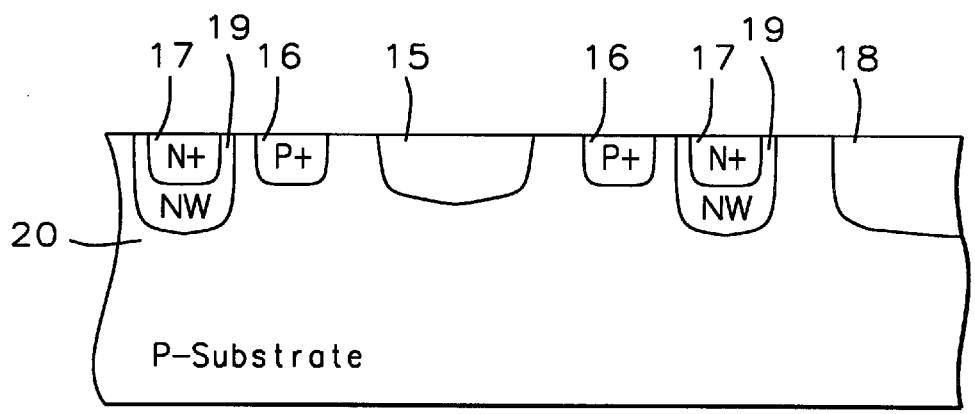
FIG. 4 – Prior Art

GUARD RING STRUCTURE WITH DEEP N WELL ON ESD DEVICES

BACKGROUND OF THE INVENTION

1. Field of Invention

This invention relates to semiconductor devices and more particular to electrostatic discharge devices with a guard ring structure to block high energy current from the internal circuits.

2. Description of the Related Art

An ESD (electrostatic discharge) device or circuit is used to protect internal circuitry on a semiconductor chip. The ESD devices and circuits are connected to each chip I/O (input/output) and power pad. When an electrostatic discharge external to the chip enters a chip pad, the ESD devices and circuits absorb the resulting high current and protect the internal chip circuitry form damage. The ESD circuits are comprised of diodes and bipolar and MOS devices, and the ESD devices or circuits are usually located near the chip pad to which they are connected.

In U.S. Pat. No. 5,912,494 (Yu) an ESD structure is described in which a heavily doped polycrystalline region is deposited on the surface of a semiconductor substrate. The polycrystalline region is used to create a lightly doped region to be formed which in turn increases the turn on voltage of a parasitic bipolar transistor. The parasitic transistor is prevented from turning on during an ESD event, allowing an ESD device to protect the internal circuits of the chip. In U.S. Pat. No. 5,438,005 (Jang) a CMOS device is provided with a deep collector guard ring which provide immunity to latch-up of the CMOS device. In U.S. Pat. No. 5,223,737 (Canclini) An ESD circuit is created with a deep N-well which forms a bipolar transistor with a resistor and zener diode to form ESD protection to internal circuits from electrostatic discharge entering a chip pad.

An ESD device or circuit is necessary for each chip bond pad to prevent damage or latch-up during an electrostatic discharge or applied voltage overshoot and voltage undershoot. When an electrostatic discharge enters a bond pad, the ESD device will attempt to absorb the resulting high current so that the internal circuits are not affected. Usually the ESD device or circuit is surrounded by either a N+, a P+, or both guard rings. These guard rings are used to prevent damage from voltage latch-up resulting from ESD and voltage overshooting or undershooting. Absorption of high current by the guard rings from an ESD or a voltage overshoot or undershoot helps prevent damage of the ESD device from overheating and resists current further flow to the internal circuits of the semiconductor chip. The effectiveness of the guard rings depend on the depth to which the guard rings are produced to block and absorb unwanted currents.

SUMMARY OF THE INVENTION

In this invention a P+ guard ring and an N+ guard ring surround the area of an ESD device or circuit. The ESD device or circuit is close to a chip bond pad and is electrically connected to the bond pad. Each bond pad has a similar arrangement for protection from an electrostatic discharge and voltage overshoot and undershoot. On a P-substrate the P+ guard ring is closest to the area containing the ESD device or circuit and surrounds that area. Surrounding and separated from the P+ guard ring is an N+ guard ring. The N+ guard ring is formed within an N-well which rests on top of a deep N-well.

The vertical structure comprising a deep N-well, an N-well sitting on top of the deep N-well and a N+ guard ring within the N-well creates a tall fence for high current from an electrostatic discharge or a voltage overshoot, absorbing unwanted current and preventing damage from heating or circuit latch-up. The P+ guard ring which resides inside and separated from the N+ guard ring is used to absorb current from electrostatic discharge or a voltage overshoot of opposite polarity from the current absorbed by the N+ Guard ring. The P+ guard ring can be created inside of a P-well

BRIEF DESCRIPTION OF THE DRAWINGS

This invention will be described with reference to the accompanying drawings, wherein:

FIG. 1 is a block diagram of the connection of an ESD device to a chip bond pad, FIG. 2 is a plan view of prior art of an ESD device or circuit with guard rings of, FIG. 3 is a cross section view of prior art of an ESD device with guard rings.

FIG. 4 is a cross section view of prior art of an ESD device with an N+ guard ring within an N-well.

DETAILED DESCRIPTION OF THE PREFERRED EMBODIMENT

Figure 5A:
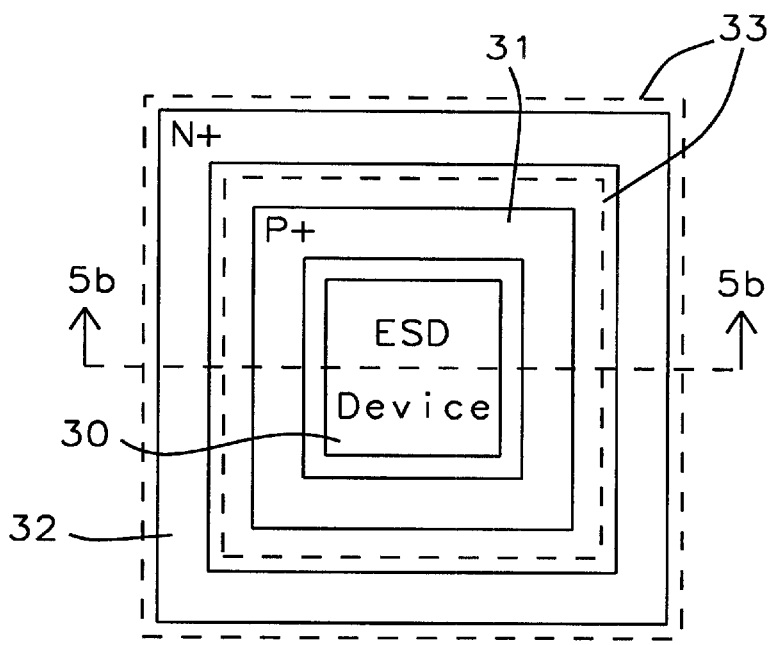
FIG. 5a is a plan view of the ESD device and guard rings of this invention.

Shown in FIG. 1 is a block diagram of the connection of an ESD device 11 between the chip bond pad 10 and the internal chip circuitry 12. Every chip pad 10 is associated with an ESD device 11. The ESD device 11 could be an ESD circuit made of various configurations of diodes transistors and resistors. The ESD device 11 is physically placed close to the bond pad 10 to minimize the impedance to the electrostatic discharge or voltage overshoot and undershoot. The ESD device or circuit absorbs the excess current resulting from an electrostatic discharge or a voltage overshoot/undershoot, and thus protecting the internal circuitry from damage or latch-up.

In FIG. 2 is shown a plan view of prior art of an ESD device or circuit 15 surrounded by a P+ guard ring 16 which is surrounded by a N+ guard ring 17. The two guard rings 16 17 are separated from each other, and each is intended to absorb current of different polarities. In FIG. 3 is show a cross section view of the ESD device 15, P+ guard ring 16 and N+ guard ring 17 of prior art on a P-substrate 20 shown in a plan view in FIG. 2. The depth of the P+ and N+ diffusions that form guard rings 16 and 17 provide some protection to the excess current flow caused by and ESD event or a voltage overshoot/undershoot; however, higher energy currents can go under the guard rings 16 17 and be absorbed by the internal circuitry 18. In FIG. 4 is shown another ESD and guard ring configuration of prior art on a P-substrate 20. An ESD device or circuit 15 is surrounded by a P+ guard ring 16 within an N+ guard ring 17. The N+ guard ring 17 is implanted within an N-well 19. The added depth of the N-well 19 helps to further reduces excess current flow from an ESD event or a voltage overshoot/undershoot to the internal circuit 18.

In FIG. 5a is shown the plan view of an ESD device or circuit 30 and the associated guard rings of this invention An ESD device or circuit 30 is surrounded by a P+ guard ring 31. Surrounding the P+ guard ring 31 is an N+ guard ring 32. The N+ guard ring 32 sits in an N-well 34 shown in FIG. 5b and on top of a deep N-well shown as dashed lines 33 in FIG. 5a. The P+ guard ring 31 is separated from the ESD device 30 and the N+ guard ring 32 is separated from the P+ guard ring 31. Although not shown, the P+ guard ring could be diffused into a P-well. The shape of the guard rings 31, 32 is shown as a square or rectangular shape, but any appropriate shape can be used including the N-well 34 and the deep N-well 35.

Figure 5B:
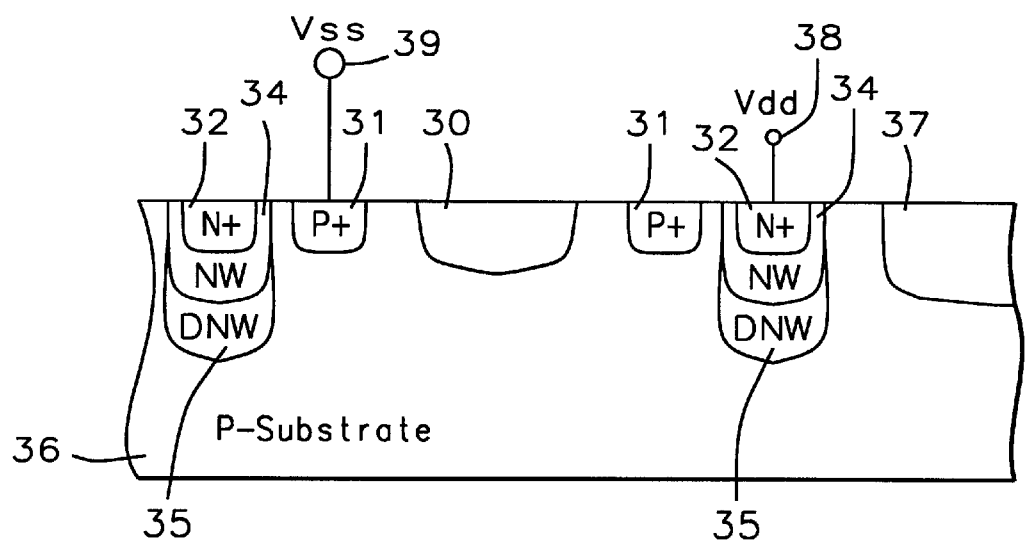
FIG. 5b is a cross section view of the ESD device and guard rings of this invention.

In FIG. 5b is shown a cross section view of the ESD device 30, or circuit, and the P+ 31 and N+ 32 guard rings. The N+ guard ring 32 is diffused into an N-well 34 which rests on top of a deep N-well 35. The vertical structure of the N+ diffusion 32, the N-well 34 and the deep N-well 35 extends deep into the P-substrate 36 and provides additional protection to the internal circuitry 37 from an ESD event and voltage overshoot. The N+ guard ring 32 is connected to Vdd 38, and the P+ guard ring 31 is connected to Vss 39, or circuit ground.

Continuing to refer to FIG. 5b, the P+ diffusion 31 is formed with a boron dopant having an implant dosage of approximately about 1E14 to 1E16 ions per square centimeter using an implant energy of approximately about 20 KeV to 100 KeV. A P-well, not shown, in which the P+ diffusion 31 could be implanted, would be formed with a boron dopant to a depth of approximately about 1 to 2 micrometers with an implant dosage of approximately about 2E12 to 1E13 ions per square centimeter using an implant energy of approximately about 100 KeV to 1 MeV and being annealed for approximately about 60 to 180 minutes at a temperature of about 900 to 1150 degrees centigrade.

Continuing to refer to FIG. 5b, the N+ diffusion 32 is formed from a dopant of arsenic or phosphorus with an implant dosage of approximately about 1E14 to 1E16 ions per square centimeter and having an implant energy of approximately about 20 KeV to 100 KeV. The N-well 34 is formed to depth of approximately about 1 to 2 micrometers from a dopant of arsenic or phosphorus with an implant dosage of approximately about 2E12 to 1E13 ions per square centimeter having an implant energy of approximately about 100 KeV to 1 MeV and being annealed for approximately about 60 to 180 minutes at a temperature of about 900 to 1150 degrees centigrade. The deep N-well 35 is formed to a depth of approximately about 2 to 3 micrometers at a height of approximately about 2 to 3 micrometers from a dopant of arsenic or phosphorus with an implant dosage of approximately about 1E12 to 1E14 ions per square centimeter at an implant energy of approximately about 800 KeV to 2 MeV and being annealed for approximately about 60 to 180 minutes at a temperature of approximately about 900 to 1150 degrees centigrade.

Figure 6:
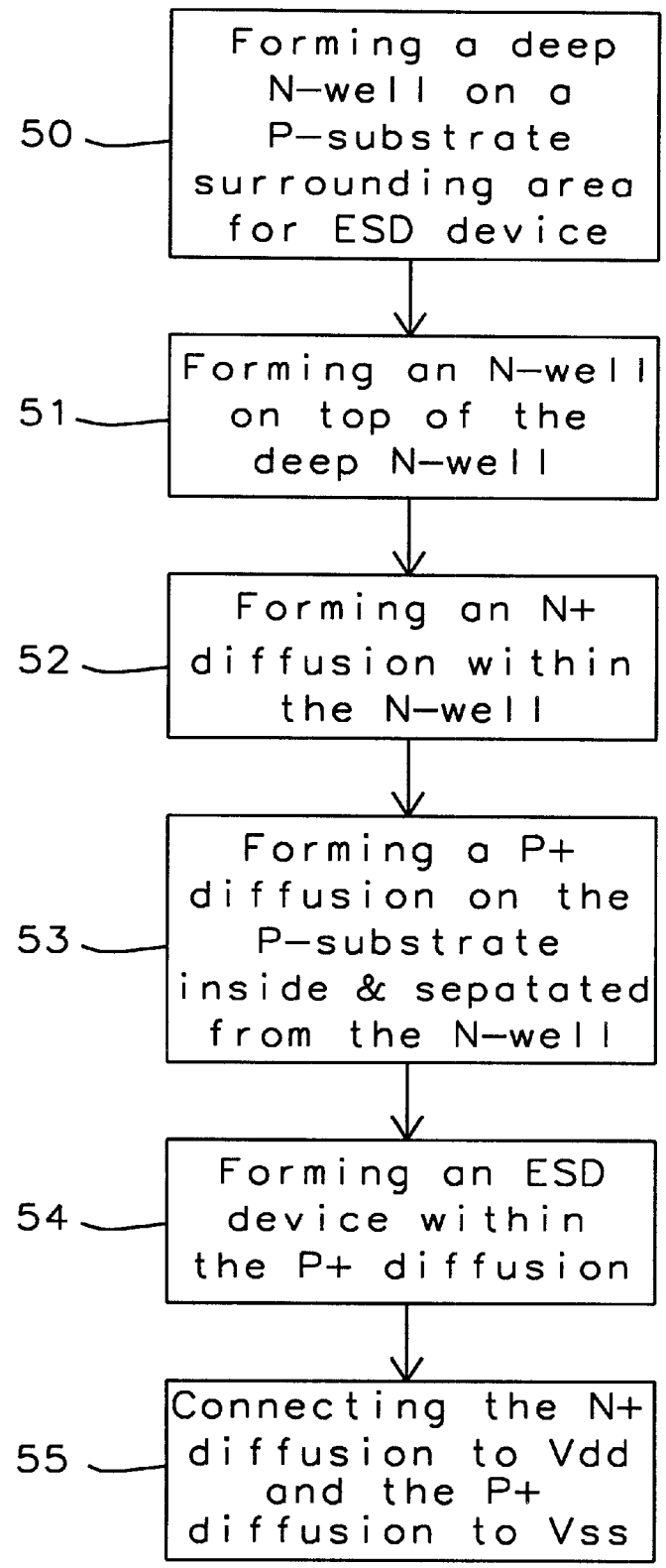

In FIG. 6 is shown the method of forming the ESD device, or circuit, with P+ and N+ guard rings including a deep N-well and an N-well associated with the N+ guard ring. A deep N-well 35 is formed on a P-substrate surrounding an area for an ESD device, or circuit, and for a P+ guard ring 50. The deep N-well 35 is formed to a depth of approximately about 2 to 3 micrometers at a height of approximately about 2 to 3 micrometers from a dopant of arsenic or phosphorus with an implant dosage of approximately about 1E12 to 1E14 ions per square centimeter at an implant energy of approximately about 800 KeV to 2 MeV and being annealed for approximately about 60 to 180 minutes at a temperature of approximately about 900 to 1150 degrees centigrade. Next an N-well 34 is formed on top of the deep N-well 35 and surrounding the area for the ESD device or circuit and for the P+ guard ring 51. The N-well 34 is formed to depth of approximately about 1 to 2 micrometers from a dopant of arsenic or phosphorus with an implant dosage of approximately about 2E12 to 1E13 ions per square centimeter having an implant energy of approximately about 100 KeV to 1 MeV and being annealed for approximately about 60 to 180 minutes at a temperature of about 900 to 1150 degrees centigrade.

Continuing to refer to FIG. 6, an N+ diffusion 32, creating an N+ guard ring, is formed inside the N-well 34 and surrounding the area for the ESD device, or circuit, and for the P+ guard ring 52. The N+ diffusion 32 is formed from a dopant of arsenic or phosphorus with an implant dosage of approximately about 1E14 to 1E16 ions per square centimeter and having an implant energy of approximately about 20 KeV to 100 KeV. A P+ diffusion 31, creating a P+ guard ring, is formed inside and separated from the N+ guard ring and surrounding the area of the ESD device, or circuit 53. The P+ diffusion 31 is formed with a boron dopant having an implant dosage of approximately about 1E14 to 1E16 ions per square centimeter using an implant energy of approximately about 20 KeV to 100 KeV.

Continuing to refer to FIG. 6, an ESD device or circuit is formed inside the P+ guard ring 31 using various circuit components comprising diodes, resistors, bipolar and MOS transistors 54. The N+ diffusion which makes up the N+ guard ring is connected to the Vdd semiconductor chip bias, and the P+ diffusion is connected to circuit ground 55. The P+ diffusion making up the P+ guard ring is used to pick up P-substrate current generated by an ESD event or a voltage overshoot.

While the invention has been particularly shown and described with reference to preferred embodiments thereof, it will be understood by those skilled in the art that various changes in form and details may be made without departing from the spirit and scope of the invention.

What is claimed is:

1. An ESD (electrostatic discharge) device with protective guard rings, comprising:
    a) an ESD device on a P-substrate connected to a chip pad on surface of said P-substrate,
    b) said ESD device surrounded by and laterally separated from a P+ diffusion guard ring within said P-substrate, wherein said P+ diffusion guard ring starts at the surface of the P-substrate and extends vertically a first distance within the P-substrate,
    c) an N+ diffusion guard ring surrounding and laterally separated from said P+ diffusion guard ring,
    d) said N+ diffusion guard ring contained within an N-well surrounding and laterally separated from the region of said P+ diffusion guard ring, wherein said N+ diffusion guard ring starts at the surface of the P-substrate and extends vertically a second distance within the P-substrate,
    e) said N-well sifting on top of a deep N-well surrounding and laterally separated from said P+ diffusion guard ring on said P-substrate, wherein said deep N-well starts at said second distance within said P-substrate and extends vertically to a third distance further from the surface of said substrate than said second distance.

2. The ESD device of claim 1, wherein said deep N-well, said N-well and said N+ diffusion form a guard ring around said ESD device.

3. The ESD device of claim 1 and claim 2, wherein the ESD device is an ESD circuit comprising combinations of diodes, MOS and bipolar devices, and resistors.

4. The ESD device of claim 1, wherein said P+ diffusion guard ring surrounding said ESD device absorbs current from high voltage discharge of opposite polarity to the current absorbed by said N+ diffusion guard ring.

5. The ESD device of claim 1, wherein an electrostatic discharge entering said chip pad is shunted away from internal chip circuitry by means of the ESD device surrounded by guard rings comprising the P+ diffusion separated from and surrounded by the N+ diffusion, the N-well and the deep N-well.

6. The ESD device of claim 1, wherein said N-well and said deep N-well provides capability to shunt electrostatic discharge current away from internal chip circuitry in addition to that shunted by the N+ diffusion guard ring.

7. The ESD device of claim 1, where in said ESD device or circuit in conjunction with said P+ diffusion and said N+ diffusion guard rings protect internal chip circuitry from signal voltage overshoot to prevent circuit latch up problems.

8. A method of creating an ESD protection for integrated circuit chips, comprising:
   a) forming a deep N-well on a P-substrate surrounding an area to contain an ESD device, wherein said deep N-well starts at a first distance below a surface of said P-substrate and extends vertically a second distance further from said surface,
   b) forming an N-well on top of the deep N-well extending vertically from the surface of the P-substrate to said first distance and said deep N-well, and surrounding said area containing said ESD device,
   c) forming a P-well separated from and contained within an area enclosed by said N-well and surrounding said area containing said ESD device,
   d) forming an N+ diffusion within said N-well and surrounding said area containing said P-well and said ESD device,
   e) forming a P+ diffusion within said P-well separated from and within inner boundaries of said N-well and surrounding said area containing said ESD device,
   f) forming said ESD device enclosed by said P+ diffusion contained within said P-well, wherein said P-well is separated from and further enclosed by said N-well.

9. The method of claim 8, wherein the ESD device is an ESD circuit comprising combinations of diodes, MOS and bipolar devices, and resistors.

10. The method of claim 8, wherein forming the P+ diffusion surrounding said ESD device is done on a P-substrate without a P-well.

11. The method of claim 8, wherein forming said deep N-well comprises a range of depth of approximately about 2–3 um, a range of height of approximately about 2–3 um, and a range of implant dosage of approximately about 1E12 to 1E14 per square centimeter using a range of implant energy of approximately about 800 KeV to 2 MeV.

12. The method of claim 11, wherein forming said deep N-well is annealed with a range of temperatures of approximately about 900 to 1150 degrees centigrade for a range of annealing time of approximately about 60 to 180 minutes.

13. The method of claim 8, wherein forming said N-well comprises a range of depth of approximately about 1–2 um with a range of implant dosage of approximately about 2E12 to 1E13 per square centimeter using a range of implant energy of approximately about 100 KeV to 1 MeV with a phosphorus or arsenic dopant and annealing for approximately about 60 to 180 minutes at a temperature range of approximately about 900 to 1150 degrees centigrade.

14. The method of claim 8, wherein forming said P-well comprises a range of depth of approximately about 1–2 um with a range of implant dosage of approximately about 2E12 to 1E13 per square centimeter using a range of implant energy of approximately about 100 KeV to 1 MeV with a boron dopant and annealing for approximately about 60 to 180 minutes at a temperature range of approximately about 900 to 1150 degrees centigrade.

15. The method of claim 8, wherein forming said N+ diffusion comprises a dopant of arsenic or phosphorus with a range of implant dosage of approximately about 1E14 to 1E16 per square centimeter using a range of implant energy of approximately about 20 KeV to 100 KeV.

16. The method of claim 8, wherein forming said P+ diffusion comprises a dopant of boron with a range of implant dosage of approximately about 1E14 to 1E16 per square centimeter using a range of implant energy of approximately about 20 KeV to 100 KeV.

* * * * *